United States Patent [19]

Woodworth et al.

[11] Patent Number: 5,760,472
[45] Date of Patent: Jun. 2, 1998

[54] SURFACE MOUNT SEMICONDUCTOR PACKAGE

[75] Inventors: Arthur Woodworth, Caterham on the Hill; Peter Richard Ewer, Oxted, both of England

[73] Assignee: International Rectifier Corporation, El Segundo, Calif.

[21] Appl. No.: 690,500

[22] Filed: Jul. 31, 1996

Related U.S. Application Data

[63] Continuation of Ser. No. 583,219, Jan. 4, 1996.

[30] Foreign Application Priority Data

Jan. 5, 1995 [GB] United Kingdom ............... 9500174

[51] Int. Cl.$^6$ ................................................... H01L 39/02
[52] U.S. Cl. .................... 257/712; 257/713; 257/734; 257/731; 257/692; 257/666
[58] Field of Search ........................ 257/666, 676, 257/712, 713, 734, 692, 731

[56] References Cited

U.S. PATENT DOCUMENTS 5,430,331  7/1995  Hamzehdoost et al. ............ 257/796

FOREIGN PATENT DOCUMENTS

| 0461639 | 12/1991 | European Pat. Off. |
|---|---|---|
| 2-98166 | 4/1990 | Japan ............ 257/676 |
| 2103418 | 2/1983 | United Kingdom . |
| 2166899 | 5/1986 | United Kingdom . |
| 93/19488 | 9/1993 | WIPO . |

Primary Examiner—Carl W. Whitehead, Jr.
Attorney, Agent, or Firm—Ostrolenk, Faber, Gerb & Soffen, LLP

[57] ABSTRACT

A surface-mount semiconductor package comprises a semiconductor which is embedded within a plastics material body (10). Electrical control connections to the semiconductor comprise first and second upstanding legs (12,14) which are offset from each other, making it easier to couple the devices in parallel. Power output is provided by metal pads (16,18). The pads may be partially sheared, to step them, thereby allowing a single thickness leadframe to be used in the manufacture of the device. On the lower face of the body (10) there are channels (22,24) which increase the electrical tracking distance and allow improved washing of residues after the device has been secured to a substrate.

16 Claims, 6 Drawing Sheets

SURFACE MOUNT SEMICONDUCTOR PACKAGE

This is a continuation of application Ser. No. 08/583,219, filed Jan. 4, 1996.

BACKGROUND OF THE INVENTION

1. Field of the Invention

The present invention relates to a surface-mount semiconductor package, and in particular although not exclusively to a power controller which is arranged in use to the surface-mounted to a PCB (printed circuit board) or an IMS (insulated metal substrate) board.

2. Related Art

A typical surface-mount semiconductor package comprises a semiconductor device which is embedded within a molded plastic material body. A metal leadframe, also partially embedded within the body, electrically connects the semiconductor device with external leas which are soldered to a track on a PCB or an IMS board.

A typical prior art example is shown in section in FIG. 1. As will be seen, the device comprises a plastic material body 2 having a vertical front face 4 from the center of which the legs 6 (of which one is shown in the drawing) emerge. The legs have a flat upper portion 8, a downwardly-cranked portion 10, and a lower flat distal portion 12. The distal portion 12 is secured to the substrate 14, typically a PCB or an IMS board, by soldering (not shown).

A problem with this type of prior art device is that it can be difficult to manufacture the legs 6 to ensure that the distal portion 12 is flat and makes good contact with the substrate. If the legs become slightly bent, for example, or if they are not manufactured with reasonable accuracy, electrical contact can be unreliable.

SUMMARY OF THE INVENTION

It is an object of the present invention to at least alleviate the difficulties of the prior art.

It is a further object to provide a relatively inexpensive surface-mount semiconductor package which is easy to mount to an appropriate substrate.

According to a first aspect of the invention there is provided a surface-mount semiconductor package comprising a semiconductor device molded within a plastic material body, a pair of input electrodes for controlling the device and an output electrode providing an output signal from the device, the input and output electrodes extending out of the body; characterised in that the input electrodes are offset from one another.

According to a second aspect of the invention there is provided a surface-mount semiconductor package comprising a semiconductor device molded within a plastic material body (10), a pair of input electrodes for controlling the device and an output electrode providing an output signal from the device, the input and output electrodes extending out of the body; characterised in that the body includes a channel on a lower surface thereof, the set lower surface in use being arranged to contact a mounting substrate.

According to a third aspect of the present invention there is provided a surface-mount semiconductor package comprising a semiconductor device molded within a plastic material body, a pair of input electrodes for controlling the device and an output electrode providing an output signal from the device, the input and output electrodes extending out of the body; characterised in that the output electrode comprises a pad which, in use, is arranged to contact a conductive portion of a mounting substrate, the pad being partially sheared.

The input electrodes preferably comprise elongate legs which are bent out of a general plane of the package. The legs, which are offset from one another, may initially form part of a planar blank (preferably of a constant thickness), the legs being bent into position during manufacture. Alternatively, if the legs are not required, they may simply be cut off.

It is preferred that in the blank the legs are generally parallel, and overlap one another. Preferably, the points at which the legs merge into the rest of the blank are adjacent to the outside edges of the blank. By providing overlapping legs, in this way, which preferably run transversely across the blank, material is saved since there is no need to make the blank excessively long purely to provide enough material from which the legs can be constructed.

Preferably, the legs form input (signal) electrodes to the semiconductor device or, alternatively, the input electrodes could comprise pads. One or more output (power) electrodes may be provided, which may preferably be in the form of pads which are arranged in use to be secured to an electrically-conducting portion of a substrate, for example a PCB or an IMS board. Alternatively, the output electrodes may take the form of legs.

The body of the semiconductor package is preferably molded of a plastic material, thereby encapsulating the semiconductor device. On a lower surface of the body may be formed a channel. In use, this forms a passage between the lower surface of the body and the mounting substrate through which washing solutions may be directed. It is further preferable for the channel to be positioned so that it forms part of an electrical tracking path along the lower surface of the body. For example, the channel may be positioned between the output electrode or electrodes, and a heat sink.

In the preferred embodiment, either the input electrodes or the output electrodes, or both, comprise pads which are, in use, arranged to contact a conductive portion of a mounting substrate. The pads are preferably partially sheared. This enables a single-thickness blank to be used, either for the input electrodes or for the output electrodes, or both. On shearing, one part of the lower surface of each pad is pushed downwardly, forming a downwardly-directed contact surface suitable for electrical connection to the substrate.

Within the plastic material body is at least one (and perhaps several linked) semiconductor devices. For example, the package could contain both a diode and a transistor.

The invention also extends to a surface-mount semiconductor package comprising a semiconductor device molded within a plastic material body, a pair of input electrodes for controlling the device and an output electrode providing an output signal from the device, the input and output electrodes extending out of the body; characterised in that the input electrodes are at one end of the body and the input electrode is at an opposite end. Such an arrangement reduces electrical noise problems (e.g., mains-borne noise).

The invention extends to an array of surface-mount semiconductor packages, each as previously described. The array may be connected in parallel using the offset feature of the input electrodes to permit one of the input electrodes on each package to be connected to a first signal track, and the other input electrode on each package to be connected to a second, parallel, signal track. The first and second signal tracks may be on a separate control board which may desirably be positioned over the array. Where the input electrodes comprise elongate legs, the legs may extend upwardly from the substrate, and may be secured to the first and second tracks of the control board. In the preferred arrangement, there may be apertures in the control board through which the legs extend. The distal ends of the legs are then soldered or otherwise electrically connected to the tracks.

The present invention also extends to a method of manufacturing a surface-mount semiconductor package. It further extends to a method of mounting such a package to a substrate, including the step of washing the package. Still further, the invention extends to the assembly of an array of such packages.

The invention further extends to any one or more compatible feature as set out above, or as referred to in the specific description, whether taken alone or in any compatible combination.

It is further envisaged in the present invention that there may be only one input (or signal) electrode in some embodiments, instead of a pair.

BRIEF DESCRIPTION OF THE DRAWINGS

The invention may be carried into practice in a number of ways and two specific embodiments will now be described, by way of example, with reference to the accompanying drawings, in which.

DETAILED DESCRIPTION OF THE PREFERRED EMBODIMENTS

Figure 2:
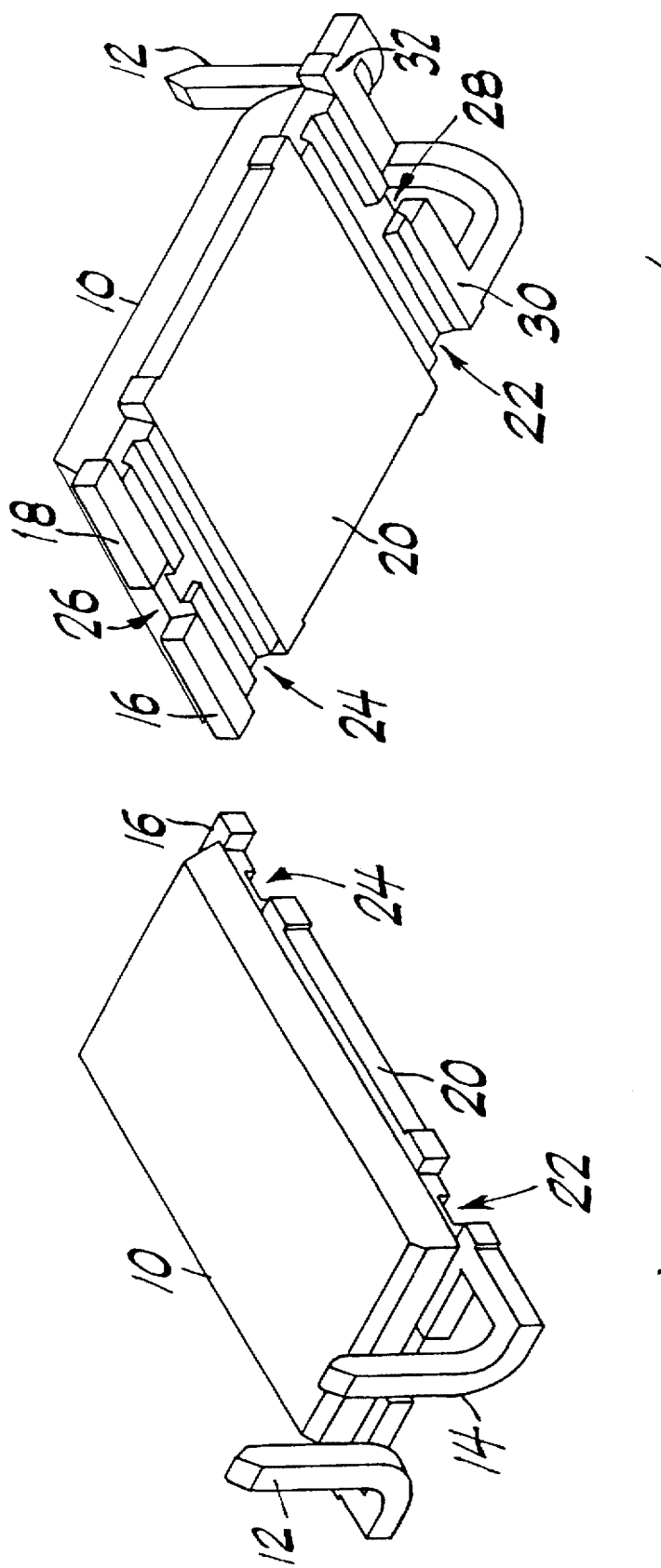
FIG. 2 shows perspective views of a surface-mount semiconductor package according to a first aspect of the present invention.

FIG. 2 shows a first embodiment of a surface-mount semiconductor package according to the present invention. The package comprises a molded plastic material body 10 within which (not shown) is embedded a semiconductor device. In the particular example shown, the semiconductor device is a power controller, control signals to which are supplied via a pair of upstanding metal legs 12,14. Power output is provided, at the other end of the device, via a pair of metal pads 16, 18. On the underside of the device there is a metal heat sink 20 which is not connected electrically to the legs 12, 14, to the pads 16, 18 or to the embedded semiconductor device.

Molded on the underside of the body 10, between the heat sink 20 and the legs 12,14 is a transverse groove 22, having a central forwardly-directed opening 28. Likewise, there is a similar groove 24 between the rear edge of the heat sink 20 and the pads 16,18. The groove 24 has a centrally-positioned rearwardly-directed opening 26 which opens into a space between the pads 16,18.

In use, the package is surface-mounted to a substrate, for example to a PCB or to an IMS board, with the heat sink 20 abutting a heat sink of the board, and the pads 16,18 being soldered to power-carrying tracks on the board. Control signals are supplied to the legs 12,14 either by soldering wires directly onto the upstanding portions of the legs, or alternatively by soldering the flat undersides of the legs 30,32 to appropriate signal tracks on the board.

Figure 3:
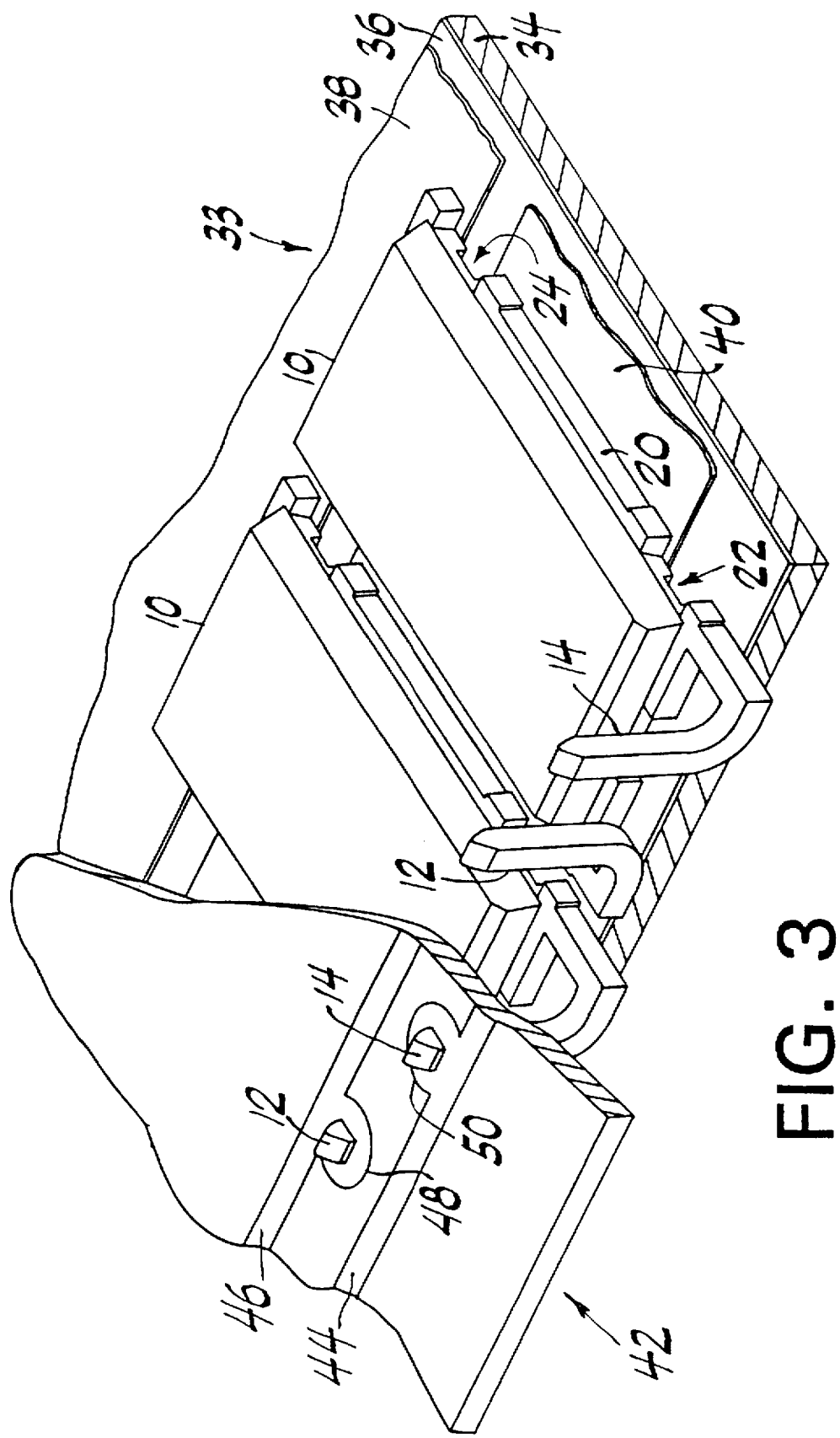
FIG. 3 shows the way in which the packages of FIG. 2 may be mounted in parallel.

FIG. 3 shows how a plurality of devices as shown in FIG. 2 may be mounted and used in parallel. In FIG. 3, two such devices are shown mounted to an IMS board. The IMS board 33 comprises a heat-conducting substrate 34 (for example of aluminium), carrying an electrically-insulating surface 36. On the surface are parallel copper tracks 38,40. The devices are mounted so that the pads 16,18 are secured (for example by soldering) to the track 38, and with the heat sink 20 being secured to the track 40.

Above the row of devices is a control board 42 having a pair of copper signal tracks 44,46. Apertures in the board allow the upstanding legs 12,14 to pass through the board, thereby coming into contact with respective enlarged contact portions 48,50 of the tracks 46,44. Good electrical contact is ensured by soldering the enlarged areas and the legs together (not shown).

It will be noted that the legs 12,14 are staggered, therefore ensuring that all of the legs 12 will be in one horizontal line, and all of the legs 14 will be in another parallel horizontal line.

In use, control signals are supplied along the tracks 44,46 simultaneously to all of the electronic devices. The power output arises in the track 38 on the IMS board 33. It has previously been indicated that the heat sinks 20 are not electrically connected to anything, and these will normally be coupled to ground via the copper track 40. Alternatively, in a variation of the embodiment, the heat sink 20 could represent one of the power output terminals, with the pads 16,18 representing the other terminal. In another variation (which would require a different displacement of copper tracks on the IMS board), the pad 16 could represent a first power output terminal, while the pad 18 represents the other power output terminal.

Because of the large voltages that may be generated on the track 38, it is important to ensure that there can be no sparking or breakdown between the track 38 and the track 40. The groove 24 acts to improve the electrical insulation between the two tracks, in that it increases the electrical tracking distance along the lower surface of the plastic material body 10. If the channel 24 were not present, and the lower portion of the body were flat, the tracking distance would be lower which would mean that a breakdown would happen at a lower voltage, particularly if the surface happens to become slightly damp.

The packages are normally secured to the IMS board by first screen-printing a mixture of flux and solder (solder paste) flux onto the board. Difficulties can arise with this procedure, however, in that one can get left with a certain amount of residue on the board. Furthermore, the solder can squeeze out sideways from underneath the pads 16,18. With prior art devices, which lack a channel 24, squeezed-out solder can easily move across a large part of the space between the track 38 and the track 40. With the provision of the channel 24, on the other hand, any stray solder will normally be taken up into the channel instead.

Once the devices have been secured to the IMS board, solder and residue can be removed by passing washing fluid along the channels 22,24. The washing fluid also passes through the openings 26,28 (FIG. 2), thereby ensuring that all of the areas around the pads 16,18 and the lower portions 30,32 of the legs are clear of unwanted material.

Figure 1:
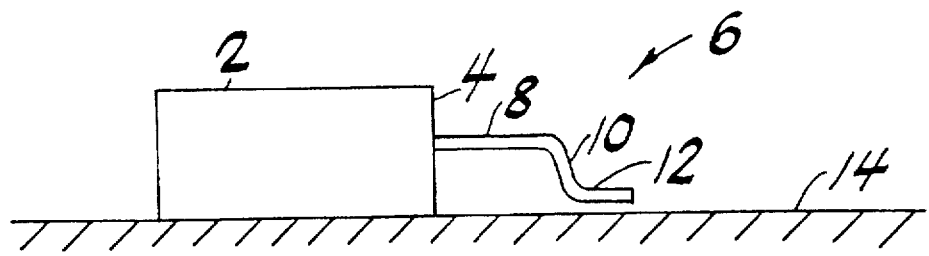
FIG. 1 is a schematic sectional view of a prior art surface-mount semiconductor package.
Figure 4:
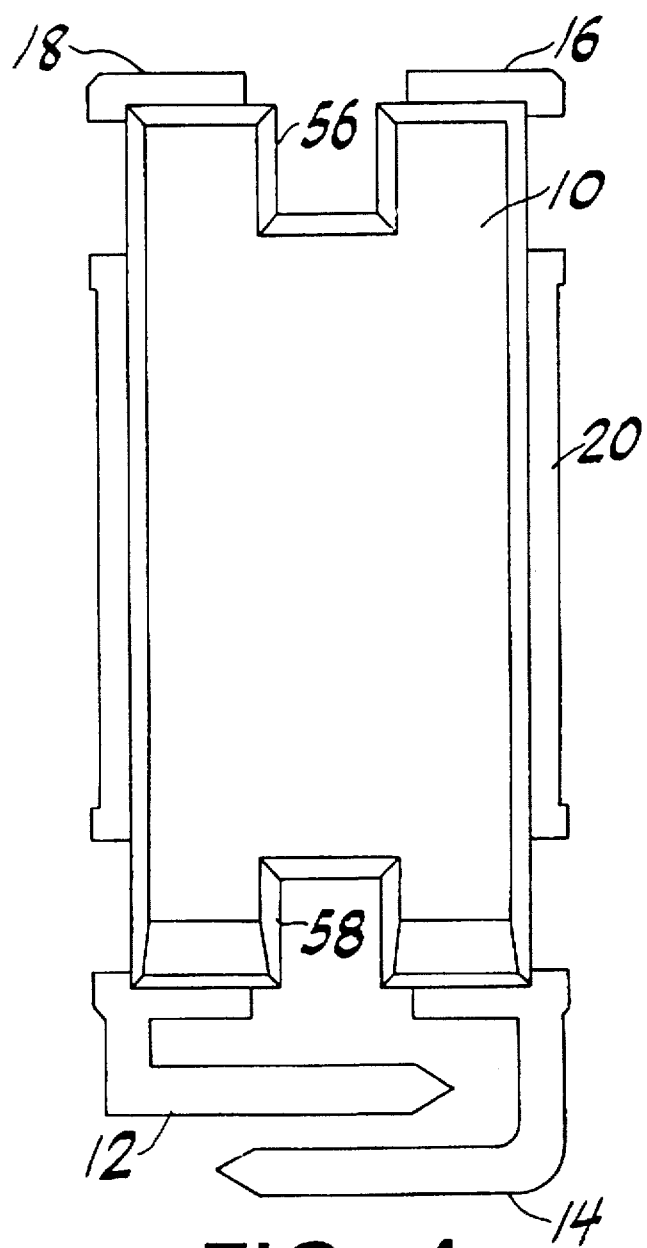
FIG. 4 shows a top view of the embodiment of FIG. 2, prior to bending of the legs of the leadframe.

FIG. 4 shows a top view of the package of FIG. 2, before the legs 12,14 have been bent upwardly. As will be seen, at this stage in the manufacture of the final product, the legs 12,14 lie in a single plane, and can be bent as required into the configuration that is designed by the end user. In some cases, the end user may prefer to supply a signal through tracks on the IMS board, and to access the semiconductor device by the lower portions 30,32 of the legs. In that case, the legs may simply be cut off.

The product shown in FIG. 4 is in fact a slight variant on the device of FIG. 2, in that it includes a cut-away portion 56 in the rear edge of the body, and a like cut-away portion 58 in the forward edge. This enables the washing solutions to enter more easily into the channels 22,24.

Figure 5:
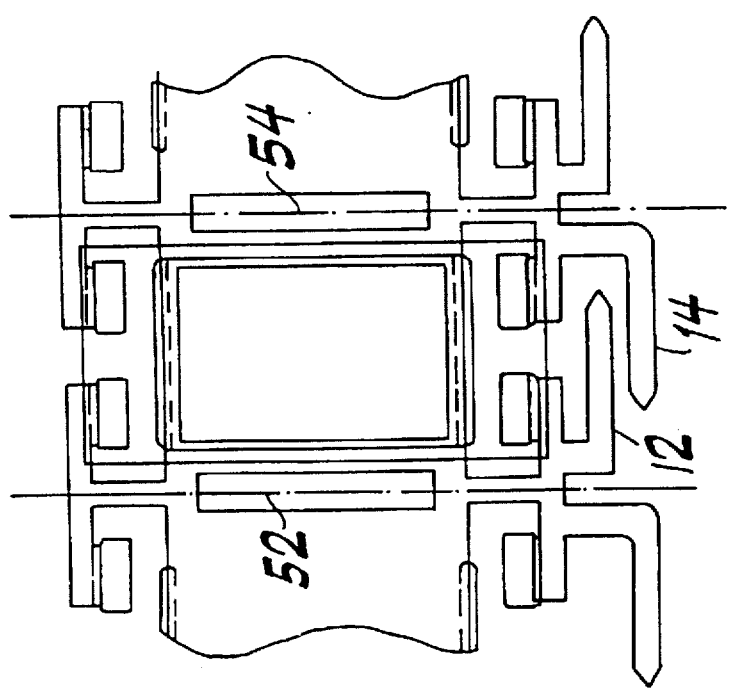
FIG. 5 shows the leadframe for the embodiment of FIG. 2.

FIG. 5 shows yet an earlier stage of the manufacturing process, namely the leadframe which will eventually form the legs 12,14 and the pads 16,18. The leadframe comprises a flat metal stamping, of substantially constant thickness throughout. As manufactured, the leadframe is an elongate structure, only part of which is shown in the figure. The leadframe is then cut up into individual portions, one for each package, along the cutting lines 52,54. An electronic device is then attached to the leadframe, which is then embedded within the plastic material body 10 to form the product shown in FIG. 4.

Figure 6:
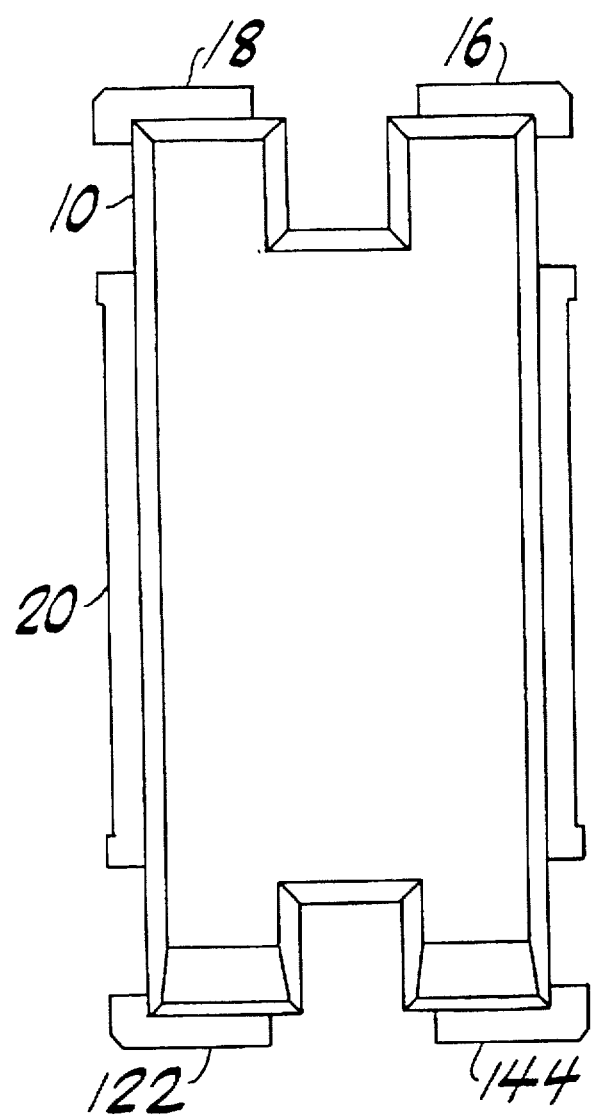
FIG. 6 is a top view of a second embodiment of the present invention.

FIG. 6 shows an alternative embodiment in which the legs 12,14 are replaced by pads 122,144 which are substantially identical with the pads 16,18. With this embodiment, control signals would normally be provided to the underside of the pads 122,144 by appropriate copper tracks on the PCB or IMS board to which the device is mounted.

Figure 7:
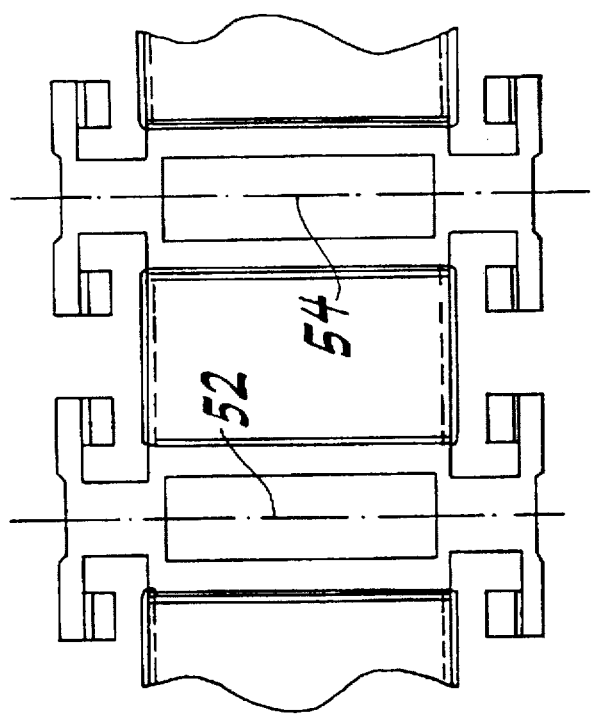
FIG. 7 shows the leadframe for the embodiment of FIG. 6.

FIG. 7 shows a portion of the leadframe suitable for manufacturing such a device. Again, the cutting lines are indicated at 52,54.

Figure 8:
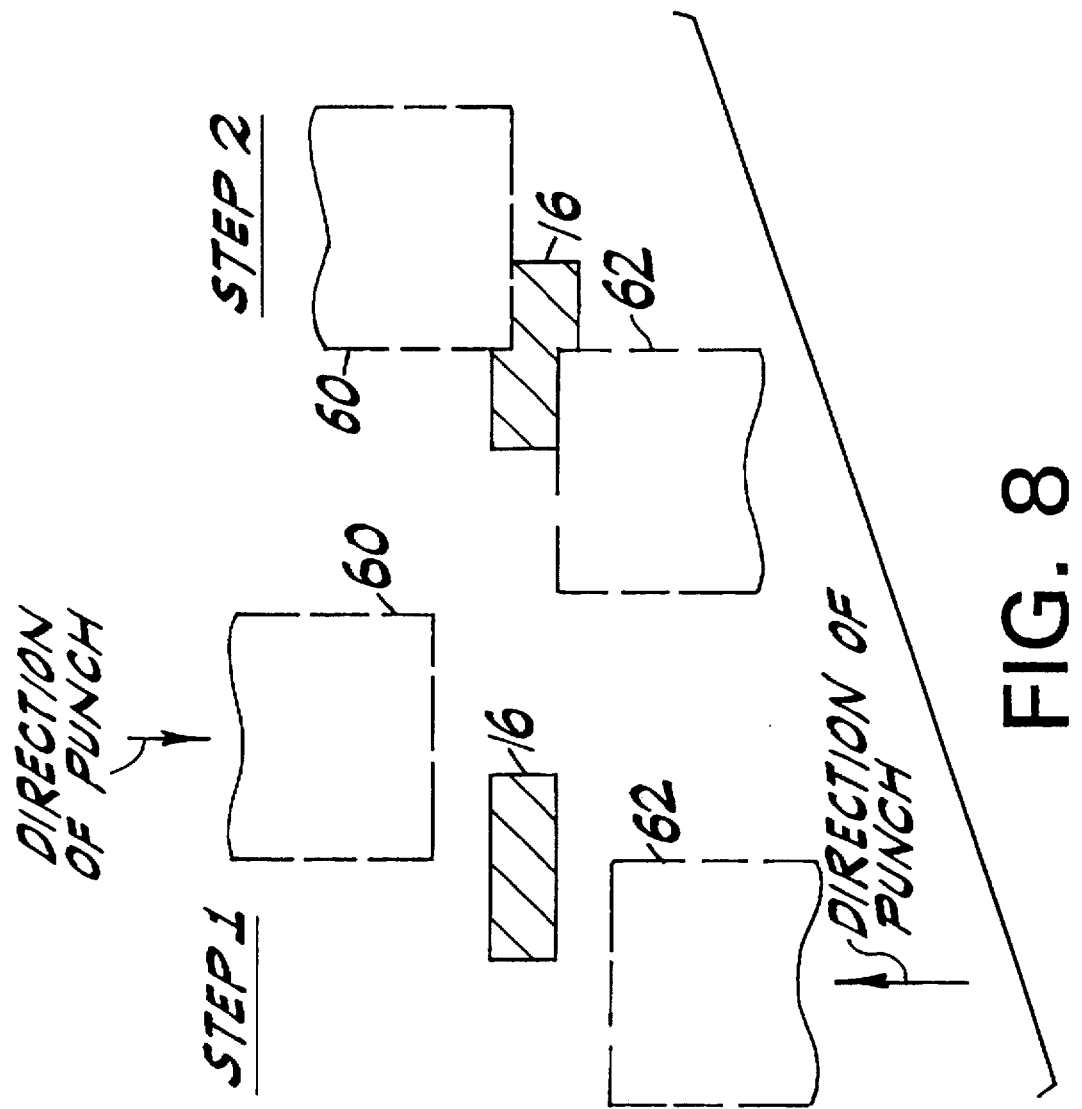
FIG. 8 illustrates how the sheared parts of FIG. 6 are constructed.

In this embodiment, the pads 16,18,122,144 are partially sheared, as may best be seen in FIG. 8. The shearing is carried out at the same time that the leadframe is punched out, and is achieved by using offset punches 60,62 which operate in exactly the same way as do a pair of scissors. The movement of the punches is, however, stopped before the pad is sheared through.

It will be appreciated that this stepped arrangement could also be used for the pads 16,18 of the embodiment of FIG. 2.

The advantage of providing a stepped pad, in this way, is that the lower surface of the pad (62 in FIG. 8) can be positioned downwardly, out of the general plane of the leadframe, without the necessity of manufacturing the leadframe from a multi-thickness blank.

Devices of the types described may desirably have a length of about 30 mm, and a width of about 18 mm. They may deal with power transfers of up to 100 watts at 40 amps.

What is claimed is:

1. A surface-mount semiconductor package comprising a thin flat rectangular conductive heat sink mount having parallel upper and lower surfaces, a semiconductor device mounted on said upper surface of said thin flat conductive heat sink; a pair of output electrodes disposed adjacent a first side of said thin flat heat sink mount and spaced therefrom and coplanar therewith; an input electrode adjacent a second side of said thin flat heat sink which is opposite to and parallel to said first side and spaced therefrom and coplanar therewith; a molded plastic housing enclosing said semiconductor device and said upper surface of said thin flat conductive heat sink and said first and second sides thereof and at least first portions of said first and second output electrodes and said input electrode which are adjacent said first and second sides; said output electrodes and said input electrode having second portions which extend beyond the periphery of said molded plastic housing and being available for connection to external conductors; said lower surface of said thin flat conductive heat sink being exposed for connection to an exterior flat heat sink; said thin flat conductive heat sink, said output electrodes and said input electrode being elements of a common lead frame; said lead frame having a uniform thickness over its full area.

2. The surface-mount package of claim 1 wherein said output electrodes are disposed at two respective and adjacent corners of said package.

3. The surface-mount package of claim 2 wherein said output electrodes are connected together and are connected to the top of said semiconductor device.

4. The surface-mount package of claim 1 which further includes a second input electrode displaced from said input electrode and spaced from and coplanar with said thin flat conductive heat sink.

5. The surface-mount package of claim 2 which further includes a second input electrode displaced from said input electrode and spaced from and coplanar with said thin flat conductive heat sink.

6. The surface-mount package of claim 3 which further includes a second input electrode displaced from said input electrode and spaced from and coplanar with said thin flat conductive heat sink.

7. A surface-mount semiconductor package comprising a thin flat rectangular conductive heat sink mount having parallel upper and lower surfaces, a semiconductor device mounted on said upper surface of said thin flat conductive heat sink; a pair of output electrodes disposed adjacent a first side of said thin flat heat sink mount and spaced therefrom and coplanar therewith; an input electrode adjacent a second side of said thin flat heat sink which is opposite to and parallel to said first side and spaced therefrom and coplanar therewith; a molded plastic housing enclosing said semiconductor device and said upper surface of said thin flat conductive heat sink and said first and second sides thereof and at least first portions of said first and second output electrodes and said input electrode which are adjacent said first and second sides; said output electrodes and said input electrode having second portions which extend beyond the periphery of said molded plastic housing and being available for connection to external conductors; said lower surface of said thin flat conductive heat sink being exposed for connection to an external flat heat sink; and first and second grooves extending from the bottom surface of said molded plastic housing and parallel to said first and second sides respectively and disposed between and parallel to and spaced from said first and second sides and said first and second output electrodes and said input electrode respectively; said first and second grooves increasing the tracking distance along the surface of said molded housing between said first and second sides and said first and second electrodes and said input electrode respectively; said first and second grooves further serving as washing channels during solder-down of said package to said external flat heat sink; said thin flat conductive heat sink, said output electrodes and said input electrode being elements of a common lead frame; said lead frame having a uniform thickness over its full area.

8. The surface-mount package of claim 7 wherein said output electrodes are disposed adjacent respective corners of said package.

9. A surface-mount semiconductor package comprising a thin flat rectangular conductive heat sink mount having parallel upper and lower surfaces, a semiconductor device mounted on said upper surface of said thin flat conductive heat sink; a pair of output electrodes disposed adjacent a first side of said thin flat heat sink mount and spaced therefrom and coplanar therewith; an input electrode adjacent a second side of said thin flat heat sink which is opposite to and parallel to said first side and spaced therefrom and coplanar therewith; a molded plastic housing enclosing said semiconductor device and said upper surface of said thin flat conductive heat sink and said first and second sides thereof and at least first portions of said first and second output electrodes and said input electrode which are adjacent said first and second sides; said output electrodes and said input electrode having second portions which extend beyond the periphery of said molded plastic housing and being available for connection to external conductors; said lower surface of said thin flat conductive heat sink being exposed for connection to a flat heat sink; and said first and second portions of said first and second output electrodes and said input electrode being partially vertically displaced from one another to improve their locking into said molded plastic housing; said thin flat conductive heat sink, said output electrodes and said input electrode being elements of a common lead frame; said lead frame having a uniform thickness over its full area.

10. The device claim 9 wherein said vertical displacement is produced by the partial shearing of said first and second portions.

11. The device of claim 7 wherein said first and second portions of said first and second output electrodes and said input electrode are partially vertically disposed from one another to improve their locking into said molded plastic housing.

12. The device of claim 11 wherein said vertical displacement is produced by the partial shearing of said first and second portions.

13. The device of claim 1 wherein said package is an elongated rectangle, said first and second sides being shorter than the sides perpendicular thereto.

14. The device of claim 2 wherein said package is an elongated rectangle, said first and second sides being shorter than the sides perpendicular thereto.

15. The device of claim 7 wherein said package is an elongated rectangle, said first and second sides being shorter than the sides perpendicular thereto.

16. The device of claim 10 wherein said package is an elongated rectangle, said first and second sides being shorter than the sides perpendicular thereto.

* * * * *